United States Patent
Nakabayashi et al.

(10) Patent No.: US 10,622,521 B2
(45) Date of Patent: Apr. 14, 2020

(54) LIGHT-EMITTING DEVICE

(71) Applicant: NICHIA CORPORATION, Anan-shi, Tokushima (JP)

(72) Inventors: Takuya Nakabayashi, Tokushima (JP); Tomokazu Maruyama, Anan (JP); Tetsuya Ishikawa, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 30 days.

(21) Appl. No.: 15/962,876

(22) Filed: Apr. 25, 2018

(65) Prior Publication Data

US 2018/0315896 A1 Nov. 1, 2018

(30) Foreign Application Priority Data

Apr. 28, 2017 (JP) ................................. 2017-089765

(51) Int. Cl.
| | | |
|---|---|---|
| *H01L 33/48* | (2010.01) | |
| *H01L 33/62* | (2010.01) | |
| *H01L 33/60* | (2010.01) | |
| *H01L 25/075* | (2006.01) | |

(52) U.S. Cl.
CPC .......... *H01L 33/483* (2013.01); *H01L 33/486* (2013.01); *H01L 33/62* (2013.01); *H01L 25/0753* (2013.01); *H01L 33/60* (2013.01)

(58) Field of Classification Search
CPC ..... H01L 33/483; H01L 33/486; H01L 33/62; H01L 25/0753; H01L 33/60
See application file for complete search history.

(56) References Cited

U.S. PATENT DOCUMENTS

| | | | |
|---|---|---|---|
| 2013/0156058 A1* | 6/2013 | Yamashita | H01L 33/486 372/44.01 |
| 2013/0200413 A1 | 8/2013 | Kashiwagi et al. | |
| 2015/0340575 A1* | 11/2015 | Nakabayash | H01L 33/642 257/91 |
| 2016/0336494 A1 | 11/2016 | Nakabayashi et al. | |
| 2017/0244016 A1 | 8/2017 | Nakabayashi et al. | |
| 2018/0033936 A1 | 2/2018 | Nakabayashi et al. | |

FOREIGN PATENT DOCUMENTS

| | | |
|---|---|---|
| JP | 2001-352105 A | 12/2001 |
| JP | 2010-003942 A | 1/2010 |
| JP | 2013-159003 A | 8/2013 |
| JP | 2016-001724 A | 1/2016 |

* cited by examiner

*Primary Examiner* — Niki H Nguyen
*Assistant Examiner* — Juanita B Rhodes
(74) *Attorney, Agent, or Firm* — Global IP Counselors, LLP

(57) ABSTRACT

A light-emitting device includes a substrate, a plurality of light-emitting elements aligned along a longitudinal direction, and a covering member. The substrate includes a pair of first depressed portions and a second depressed portion each opening on a back surface and a bottom surface of a base and positioned on both end sides of the base in the longitudinal direction. The second depressed portion has a width larger than a width of the first depressed portions as measured along a height direction. First metal films extend from inside the first depressed portions to the back surface. A second metal film extends from inside the second depressed portion to the back surface. A solder mask covers at least a part of each of the first metal films and at least a part of the second metal film on the back surface of the base.

17 Claims, 4 Drawing Sheets

LIGHT-EMITTING DEVICE

CROSS-REFERENCE TO RELATED APPLICATION

This application claims priority to Japanese Patent Application No. 2017-089765, filed on Apr. 28, 2017, the disclosure of which is hereby incorporated by reference in its entirety.

BACKGROUND

The present disclosure relates to a light-emitting device.

It has been proposed that side-view light-emitting devices each including a semiconductor light-emitting element arranged on a substrate, a phosphor plate, and a reflective layer that surrounds the semiconductor light-emitting element and the phosphor plate and contains light-reflective fine particles.

Bonding strength of such light-emitting devices to mounting boards is small because of recent downsizing of the light-emitting devices, and various improvements in the bonding strength are under consideration (for example, Japanese Unexamined Patent Application Publication No. 2010-3942).

Certain embodiment of the present disclosure has an object to provide a light-emitting device that can ensure sufficient bonding strength even in a small size.

SUMMARY

A light-emitting device according to an embodiment of the present disclosure includes a substrate, a plurality of light-emitting elements, and a covering member. The substrate includes a base, first metal films, a second metal film, a solder mask, and a wiring layer. The base has a front surface extending in a longitudinal direction and a width direction, a back surface opposite to the front surface, a bottom surface adjacent to the front surface and extending in the longitudinal direction and a depth direction, and an upper surface opposite to the bottom surface. The base defines a pair of first depressed portions opening on the back surface and the bottom surface of the base and positioned on both end sides of the base in the longitudinal direction. The base defines a second depressed portion opening on the back surface and the bottom surface of the base, disposed between the pair of first depressed portions, and having a width larger than a width of each of the first depressed portions as measured along a height direction. The first metal films extend respectively from inside the first depressed portions to the back surface. The second metal film extends from inside the second depressed portion to the back surface. The solder mask covers at least a part of each of the first metal films and at least a part of the second metal film on the back surface of the base. The wiring layer is on the front surface of the base. The plurality of light-emitting elements are connected to the wiring layer and aligned along the longitudinal direction. The covering member has light reflectivity. The covering member covers at least a part of a lateral surface of each of the plurality of light-emitting elements and at least a part of the front surface of the base.

Certain embodiment of the present disclosure can provide a light-emitting device that can ensure sufficient bonding strength even in a small size.

DETAILED DESCRIPTION OF EMBODIMENTS

Figure 1:
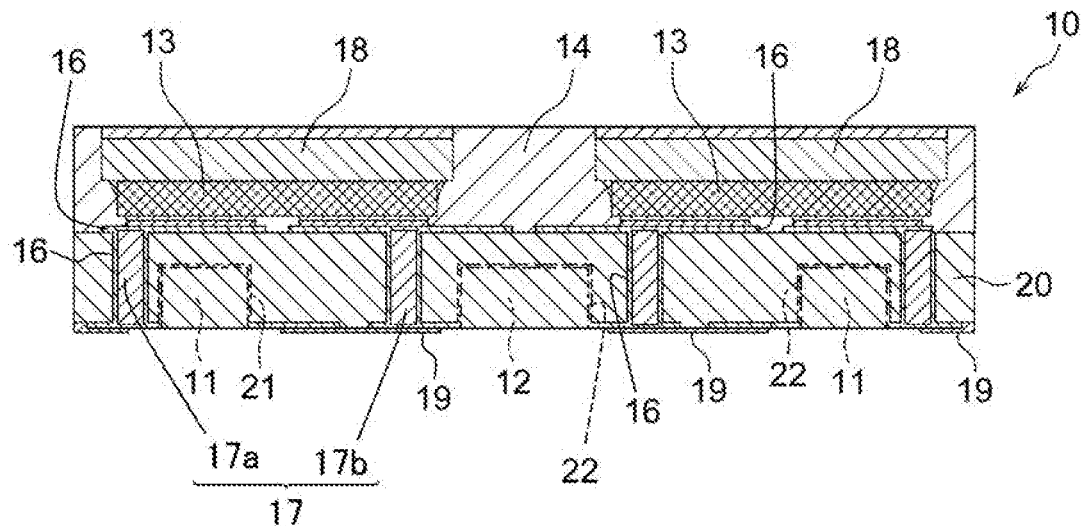
FIG. 1 is a schematic sectional view of the central portion of a light-emitting device representing an embodiment of the present disclosure taken along the longitudinal direction.

Light-emitting devices to be described below are intended to embody the technical concept of the present invention and do not limit the present invention to the devices below. It is noted that there is a case where magnitudes or positional relations of members illustrated in the drawings are exaggerated in order to clarify the descriptions.

For each of the light-emitting devices in the present disclosure, the light-extracting surface is referred to as the front surface, the surface opposite to the front surface as the back surface, a surface adjacent to the front surface and extending in the longitudinal direction and the width direction as the bottom surface, and the surface opposite to the bottom surface as the upper surface.

A light-emitting device 10 in an embodiment of the present disclosure includes, for example, a substrate 20, a plurality of light-emitting elements 13, and a covering member 14 as shown in FIG. 1. Preferably, the light-emitting device 10 further includes light-transmissive members 18 on or above the front surfaces of the light-emitting elements 13. The front surfaces of the light-emitting elements 13 mean the surfaces opposite to the surfaces of the light-emitting elements facing the front surface of a base.

Figure 2A:
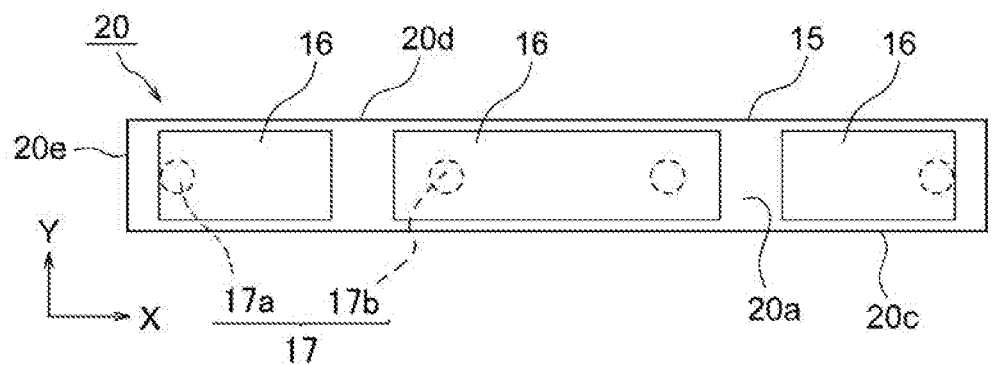
FIG. 2A is a schematic front view of a substrate employed in the light-emitting device shown in FIG. 1.

As shown in FIG. 2A, the substrate 20 includes a base 15 and wiring layers 16. The base 15 has a front surface 20a extending in a longitudinal direction X and a width direction Y, a back surface 20b opposite to the front surface, a bottom surface 20c adjacent to the front surface 20a, an upper surface 20d opposite to the bottom surface 20c, and lateral surfaces 20e each being adjacent to the front surface 20a, the back surface 20b, the bottom surface 20c, and the upper surface 20d. The wiring layers are disposed on the front surface of the base. In the case where the light-emitting device is mounted as a side-view device, the bottom surface 20c faces a mounting board. The surfaces of the substrate correspond to respective surfaces of the base. In other words, the front surface 20a of the base corresponds to the front surface of the substrate, the back surface 20b of the base corresponds to the back surface of the substrate, the bottom surface 20c of the base corresponds to the bottom surface of the substrate, the upper surface 20d of the base corresponds to the upper surface of the substrate, and the lateral surfaces 20e of the base corresponds to the lateral surfaces of the substrate. The light-emitting elements 13 are connected to the wiring layers and aligned in the longitudinal direction of the substrate 15. The covering member 14 has a light-reflectivity and covers the lateral surfaces of the light-emitting elements 13 and the front surface 20a of the base 15.

Figure 2B:
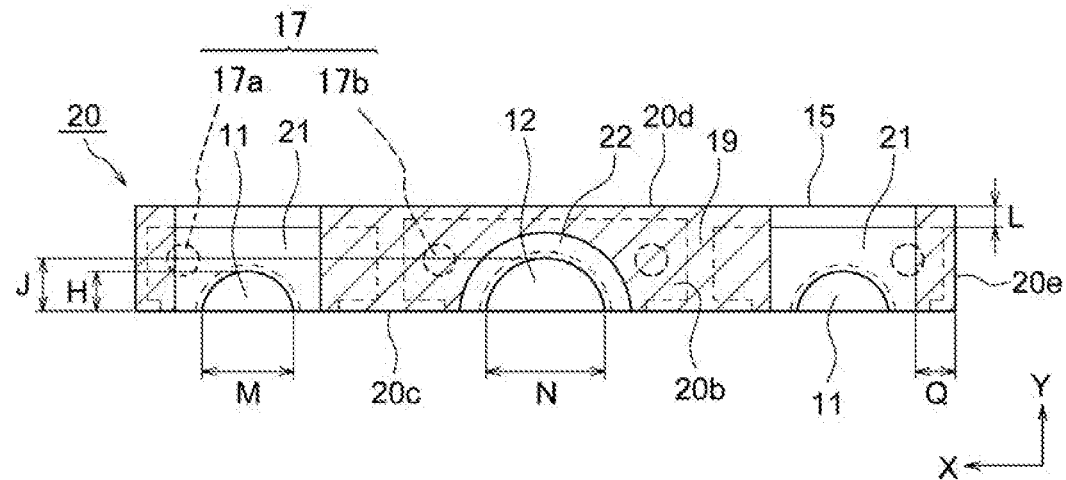
FIG. 2B is a schematic back view of the substrate in FIG. 2A.

As shown in FIG. 2B, the base 15 has a pair of first depressed portions 11 and a second depressed portion 12. The pair of first depressed portions 11 open to the back surface of the base and the bottom surface of the base. The pair of first depressed portions 11 are respectively formed on both sides in the longitudinal direction of the substrate. The second depressed portion 12 opens to the back surface and the bottom surface of the base, is positioned between the pair of first depressed portions 11, and has a greater width in the width direction than those of the first depressed portions. The substrate 20 includes the base 15, therefore, the substrate 20 has the pair of first depressed portions 11 and the second depressed portion 12. The substrate 20 also includes first metal films 21, a second metal film 22, and a solder mask 19. The first metal films 21 and the second metal film 22 respectively extend from inside the first depressed portions 11 and the second depressed portion 12 to the back surface 20b. The solder mask 19 covers at least part of each of the first metal films and the second metal film located on the back surface of the base.

The light-emitting device 10 is bonded to the mounting board with bonding members, such as solder, that is formed inside the pair of first depressed portions 11 and the second depressed portion 12. The second depressed portion 12 having a greater width in the width direction can increase the volume of the bonding member provided inside the second depressed portion 12. Hence, the bonding strength is ensured and defective mounting is reduced when the light-emitting device 10 is mounted on or above the mounting board, and the mountability is thus improved. Also, covering the first metal films 21 and the second metal film 22 with the solder mask 19 suppresses short circuits between the first metal films 21 and the second metal film 22 via the bonding members. In addition, covering the first metal films 21 and the second metal film 22 with the solder mask 19 suppresses, for example, delamination of the first metal films 21 and the second metal film 22, thereby achieving stable mounting.

The light-emitting device 10 in the present disclosure is preferably a side-view light-emitting device, but a top-view light-emitting device may be employed. The side-view light-emitting device has a structure that, for example, the light-extracting surface (i.e., front surface) of the light-emitting device is substantially perpendicular to the mounting board surface on which the light-emitting device is mounted. The top-view light-emitting device has a structure that, for example, the light-extracting surface (i.e., front surface) of the light-emitting device is substantially parallel to the mounting board surface on which the light-emitting device is mounted.

The shape of the front surface (i.e., light-extracting surface) of the light-emitting device can be appropriately selected. A rectangular shape is preferable to enable enhancement of mass production. In particular, in the case where the light-emitting device is used as a light source for a backlight, the shape of its front surface (i.e., light-extracting surface) is preferably a rectangle having long sides and shorter sides. In the case where the light-emitting device is used as a light source for a flash, the shape of its front surface (i.e., light-extracting surface) is preferably a square.

Substrate 20

As shown in FIGS. 2A and 2B, the substrate 20 is a member on or above which the light-emitting elements are to be mounted. The substrate 20 includes the base 15, the wiring layers 16, the pair of first depressed portions 11, the second depressed portion 12, the first metal films 21, the second metal film 22, and the solder mask 19, as described above.

Base 15

The base 15 can be formed with, for example, a resin, a fiber-reinforced resin, a ceramic, glass, a metal, or paper. Examples of the resin or the fiber-reinforced resin include epoxy resins, glass epoxy resins, bismaleimide-triazine (BT) resins, and polyimides. Examples of the ceramic include aluminum oxide, aluminum nitride, zirconium oxide, zirconium nitride, titanium oxide, titanium nitride, and mixtures of these. Examples of the metal include copper, iron, nickel, chromium, aluminum, silver, gold, titanium, and alloys of these metals. Among these examples, insulating materials are preferable. A filler and the like may be mixed in the ceramic, resin, glass, or the like.

The base 15 is formed by using preferably a material having physical properties similar to the linear expansion coefficient of the light-emitting elements. This can alleviate separation of the light-emitting elements from the substrate, and breakage of the light-emitting elements due to differences in thermal expansion coefficient from the substrate. The linear expansion coefficient of the base 15 is preferably 15 ppm/° C. or less, more preferably 10 ppm/° C. or less. The lower limit of the linear expansion coefficient of the base 15 is, for example, 1 ppm/° C. or more. The linear expansion coefficient of the light-emitting elements changes depending on the types of the semiconductor materials and the like, and is close to the linear expansion coefficient of a material occupying dominant volumes in the light-emitting elements. Hence, since the volumes of sapphire substrates are usually dominant in the case where the light-emitting elements include the sapphire substrates, the linear expansion coefficient is close to the linear expansion coefficient of the sapphire substrates, for example, about 7.7 ppm/° C. In the case where the light-emitting elements consists of only semiconductor layers without sapphire substrates, the linear expansion coefficient of the base is close to the linear expansion coefficient of the semiconductor layers, for example, about 5.5 ppm/° C. in the case of light-emitting elements including GaN-based semiconductor layers.

The base 15 has the thickness in a direction from the front surface toward the back direction. The thickness of the base 15 is preferably 0.05 mm or more, more preferably 0.2 mm or more, from the aspect of ensuring the mechanical strength of the substrate, however, is also preferably 0.5 mm or less, and is even more preferably 0.4 mm or less.

As described later, the base 15 preferably has one or more via holes 17 penetrating from the front surface 20a to the back surface 20b. The via holes 17 allow electrical connection of the wiring layers located on the front surface of the base to the first metal films and/or the second metal film. The via holes 17 preferably include first via holes 17a and second via holes 17b. The first via holes 17a electrically connect the first metal films 21 and the wiring layers 16. In other words, the wiring layers are connected to the first metal films disposed in the first depressed portions via the first via holes. The second via holes 17b electrically connect the second metal film 22 and the wiring layer 16. In other words, the wiring layer is connected to the second metal film disposed in the second depressed portion via the second via holes. The number of the first via holes 17a and the number of the second via holes 17b may be one, but are preferably two or more. If a plurality of first via holes 17a and/or second via holes 17b are formed, heat generated from the light-emitting elements 13 can be efficiently transferred to the first metal films 21 and/or the second metal film 22 located in the depressed portions 11 and 12 through the first via holes 17a and/or the second via holes 17b. The heat transferred to the first metal films and/or the second metal film is transferred to the mounting board via the bonding members, and the heat dissipation performance of the light-emitting device is thus improved. If a plurality of second via holes 17b, which are located near the center of the light-emitting device 10, are formed, the heat dissipation performance of the light-emitting device is likely to be improved.

Wiring Layers 16

At least a pair of wiring layers 16 are formed on the front surface 20a of the base 15. The pair of wiring layers 16 may be disposed not only on the upper surface but on lateral surfaces or the back surface of the base 15 or inside the base. For example, it is preferable that the base 15 have the via holes 17 penetrating from the front surface 20a to the back surface 20b and that the wiring layers 16 be disposed also inside the via holes 17.

The wiring layers 16 are formed of an electrically-conductive material, and materials known in the art can be used. The wiring layers 16 may have a single-layer structure or a layered structure. Examples of the material include copper, iron, nickel, tungsten, chromium, aluminum, silver, gold, titanium, palladium, rhodium, and alloys of these materials. Among these materials, copper or copper alloys are preferable in view of heat dissipation performance. The wiring layers 16 can be formed of, for example, a layered material such as Cu/Ni/Au layered from the base. On the surface of the wiring layers 16, a layer made of silver, platinum, aluminum, rhodium, gold, an alloy of these, or the like may be disposed in view of ensuring wettability of bonding members described later and/or light reflectivity. The material and/or structure of at least a pair of wiring layers 16 is preferably the same, but may not be the same.

The thickness of the wiring layers 16 is preferably 5 µm or more in view of improvement in heat dissipation performance.

The via holes 17 may be provided with the wiring layers 16 located inside the via holes and filler members surrounded by the wiring layers 16 in a front view. The filler members may be electrically-conductive or insulative. Resin materials are preferably used for the filler members. Uncured resin materials generally have higher fluidity than the fluidity of unhardened metal materials and thus are easily filled into the via holes. Hence, use of a resin material for the filler members facilitates manufacture of the substrate. Examples of the resin materials that are easily filled include epoxy resins. In the case where a resin material is used as the filler members, an additive member is preferably contained in order to decrease the linear expansion coefficient. This can reduce the linear expansion coefficient difference between the filler members and the wiring layers 16 located inside the via holes, and can alleviate generation of gaps between the wiring layers 16 located inside the via holes and the filler members due to heat generated from the light-emitting elements. Examples of the additive member include silicon oxide. In the case where a metal material is used as the filler members, the heat dissipation performance can be improved.

The pair of wiring layers 16 are preferably aligned in a row on the front surface 20a of the base 15.

The shape of the wiring layers 16 can be appropriately set according to the form of the electrodes of the light-emitting elements. Examples of the shape include an ellipse, a circle, or a polygon such as a quadrilateral in a plane view on the front surface 20a of the base 15. Among these shapes, quadrilaterals are preferable.

First Depressed Portions 11 and Second Depressed Portion 12

The light-emitting device 10 has the pair of first depressed portions 11 and the second depressed portion 12 that open on the back surface 20b and the bottom surface 20c of the base 15.

The shapes of the first depressed portions 11 and the second depressed portion 12 can be appropriately set. Examples of the shapes on the back surface 20b and the bottom surface 20c include semicircles, semiellipses and polygons such as triangles and quadrilaterals. Among these shapes, substantial semicircles and substantial semiellipses are preferable. Forming the opening shapes of the depressed portions on the back surface into substantial semicircles without corners can prevent or discourage stress from locally concentrating in the depressed portions, and thus can alleviate breakage of the base.

The pair of first depressed portions 11 are respectively disposed on both sides in the longitudinal direction X of the base 15. In the case where the base 15 has the first via holes 17a, and the wiring layers 16 are disposed inside the first via holes 17a as described above, each of the pair of first depressed portions 11 preferably does not overlap the first via holes 17a in a front view or back view. Each of the pair of first depressed portions 11 does not overlap the first via holes 17a, thus the base can be thicker than a thickness of a base having a first depressed portions overlapping a first via holes 17a. This can enhance the strength of the base.

Figure 3A:
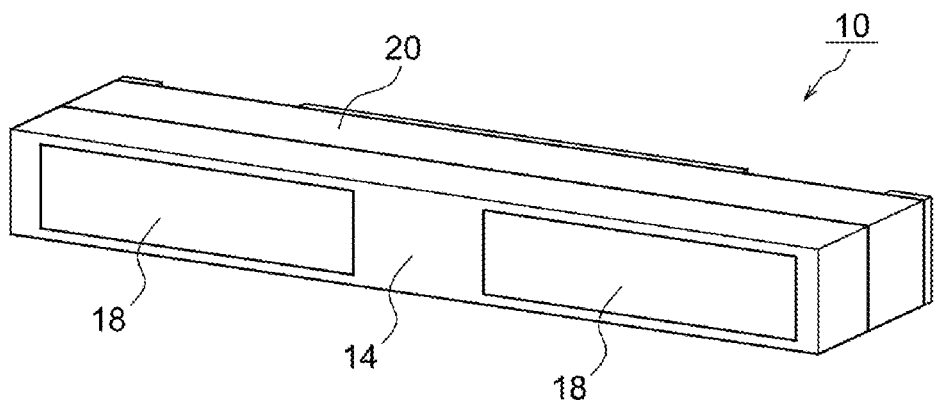
FIG. 3A is a schematic front perspective view of the light-emitting device shown in FIG. 1.
Figure 3B:
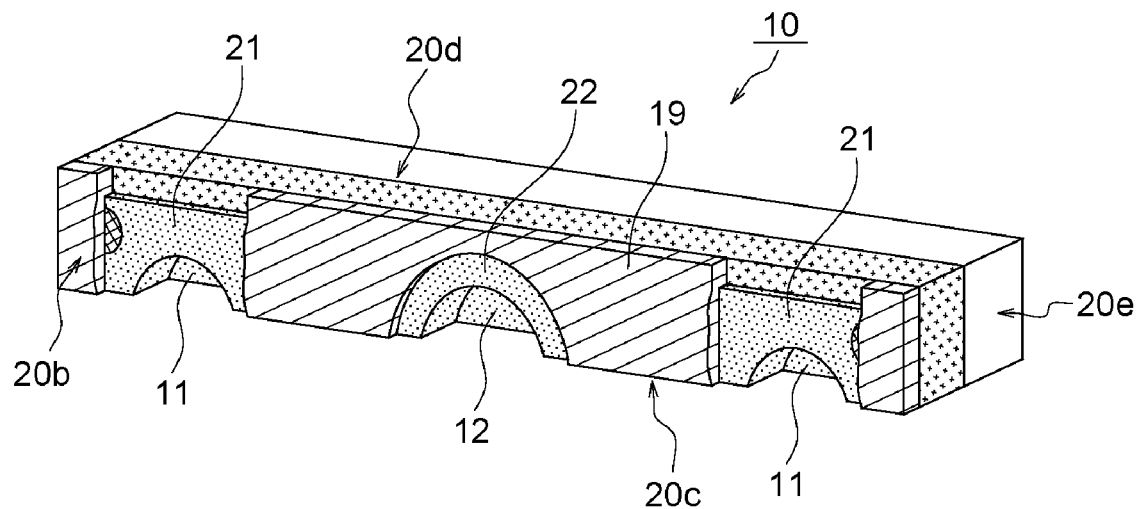
FIG. 3B is a schematic back perspective view of the light-emitting device shown in FIG. 1.
Figure 3C:
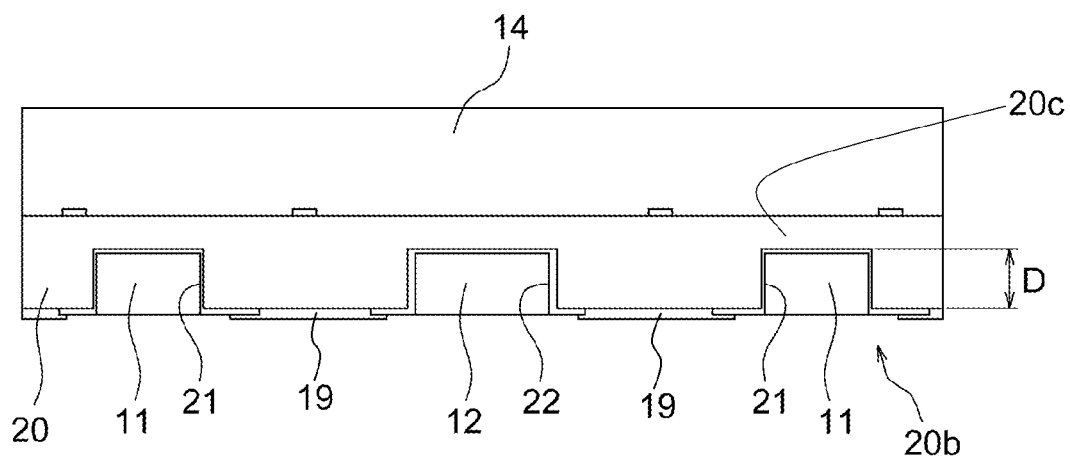
FIG. 3C is a schematic bottom view of the light-emitting device shown in FIG. 1.
Figure 3D:
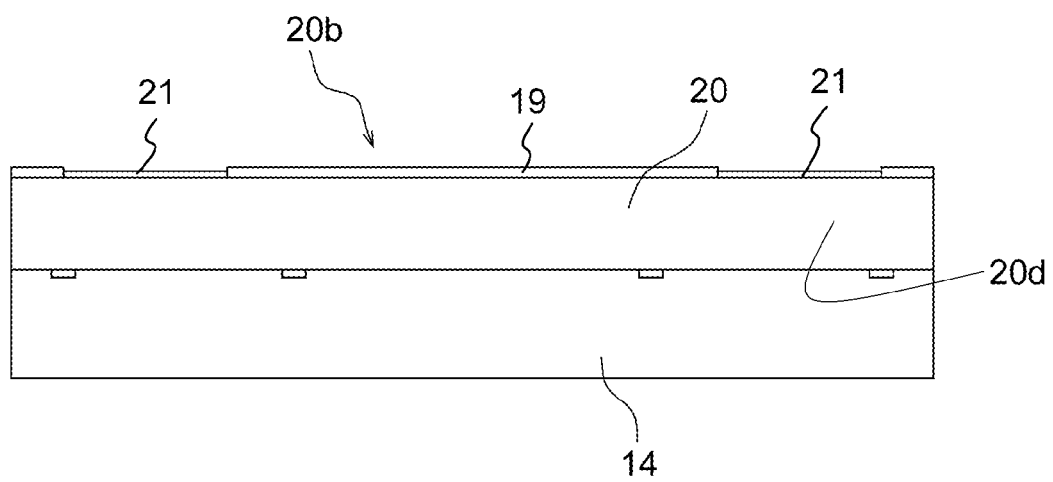
FIG. 3D is a schematic top view of the light-emitting device shown in FIG. 1.

The sizes of the first depressed portions 11 can be small enough to ensure the strength of the base 15. For example, the first depressed portions 11 has the width M on the back surface of the base 15 in the bottom surface 20c side. The width M may be in a range of from 1/10 to 1/5, preferably in a range of from 1/8 to 1/6, of the length of the light-emitting device in the longitudinal direction X. Specifically, examples of the length include in a range of from 0.2 mm to 0.7 mm in the case where the length of the light-emitting device in the longitudinal direction X is in a range of from 2 mm to 3 mm. The height H of the first depressed portions is defined from the bottom surface 20c to the highest portion of the depressed portion in the width direction on the back surface 20c (i.e., width direction of the substrate 20). Examples of the height H of the first depressed portion 11 include 1/4 to 1/2. Specific examples of the height include in a range of from 0.075 mm to 0.2 mm in the case where the length of the light-emitting device in the width direction Y is in a range of from 0.3 mm to 0.4 mm. The depth (i.e., a depth D in FIG. 3C) of the first depressed portion 11 is defined from the back surface 20b to the furthest portion of the depressed portion in the width direction on the bottom surface 20c. Examples of the depth include in a range of from 1/5 to 1/1.5. Specific examples of the depth include in a range of from 0.15 mm to 0.2 mm in the case where the thickness of the base 15 is in a range of from 0.3 mm to 0.4 mm. The first depressed portion 11 may be in contact with an edge close to the lateral surface 20e on the back surface 20b, but is preferably separated from the edge. Specifically, the first depressed portion 11 is preferably separated from the edge close to the lateral surface 20e by a distance Q that measures 0.1 mm or more, preferably 0.2 mm or more.

The pair of first depressed portions 11 may be disposed at different distances from the edges and may have different sizes and shapes on the back surface 20b of the base 15, but are preferably bilaterally symmetric about the center line of the base 15 parallel to the width direction Y. This structure achieves effective self-alignment after the light-emitting device is mounted on the mounting board with the bonding members, thereby enabling precise mounting of the light-emitting device within the mounting region.

The second depressed portion 12 is positioned between the pair of first depressed portions 11 and has greater height (i.e., height J in FIG. 2B) than the first depressed portions 11, in the width direction Y of the substrate 20. The second depressed portion 12 has, for example, a height J that is in a range of from 2% to 20% larger than the height H of the first depressed portions 11 in the width direction Y. A width N of the second depressed portion 12 in the longitudinal direction X is preferably larger than the width M of the first depressed portions 11. The width N of the second depressed portion 12 can be, for example, in a range of from 5% to 30% larger than the width M of the first depressed portions 11 in the longitudinal direction X.

In the case where the base 15 has the second via holes 17b and the wiring layers 16 are disposed inside the second via holes 17b as described above, the second depressed portion 12 preferably does not overlap the second via holes 17b in a front view. This structure improves the strength of the base compared with the strength of a base in the case where a second depressed portion overlaps the second via holes in a front view.

The first depressed portions 11 and the second depressed portion 12 can be formed by a method known in the art, such as drilling.

First Metal Films 21 and Second Metal Film 22

The first metal films 21 and the second metal film 22 respectively extend from inside the first depressed portions 11 and the second depressed portion 12 to the back surface 20b.

Preferably, the first metal films 21 and the second metal film 22 respectively cover the entire inner walls of the first depressed portions 11 and the second depressed portion 12. In the case where the wiring layers 16 are disposed inside the first via holes 17a as described above, the first metal films 21 are preferably connected to the wiring layers 16 inside the first via holes 17a. Also, in the case where the second via holes 17b are formed and the wiring layers 16 are disposed inside the via holes 17b, the second metal film 22 is preferably connected to the wiring layers 16 inside the via holes 17b.

The first metal films 21 and/or the second metal film 22 preferably have large areas on the back surface 20b of the base. This structure can improve the heat dissipation of the light-emitting device. Part of the base 15 is preferably exposed on at least an edge close to the upper surface 20d on the back surface 20b of the base. If the first metal films 21 and/or the second metal film 22 is not located on the upper side of the light-emitting device, short circuits of the light-emitting device is less likely to occur. For example, part of the back surface 20b of the base 15 is preferably exposed between the upper surface 20d of the base and the first metal films 21 anchor the second metal film 22. A width L of the exposed portion is, for example, in a range of from 0.05 mm to 0.3 mm. The width L of the exposed portion of the base 15 between the first metal films 21 and the upper surface 20d may be the same as or different from the width of an exposed portion of the base 15 between the second metal film 22 and the upper surface 20d.

Examples of the shapes of the first metal films 21 anchor the second metal film 22 on the back surface 20b include a quadrilateral that is connected to an edge close to the bottom surface 20c and is not connected to an edge close to the upper surface 20d, and shapes having projections or depressions at corners of quadrilaterals, such as T-shapes and L-shapes. The first metal films 21 and the second metal film 22 are separated from each other. The distance from each of the first metal films 21 to the second metal film 22 can be appropriately set to the extent that electrical insulation is ensured. The distance can be in a range of from 0.01 mm to 0.1 mm, for example.

The first metal films 21 may each have the same size as the second metal film 22, but the sizes are preferably different. For example, the second metal film 22 is preferably larger than the first metal films 21 in the longitudinal direction and/or the width direction, more preferably larger than the first metal films 21 in both of the longitudinal direction and the width direction.

The first metal films 21 and the second metal film 22 can have single-layer structures or multilayer structures formed with materials selected from the above electrically-conductive materials. The first metal films 21 and the second metal film 22 can be formed by various methods known in the art, such as sputtering, vapor deposition, and plating. Among these methods, films of Ni—Au plating are preferable. The thicknesses thereof can be in a range of from 0.05 μm to 1 μm, for example.

Solder Mask 19

A solder mask 19 covers at least part of each of the first metal films 21 and the second metal film 22 located on the back surface 20b of the base 15.

The solder mask 19 is comprised of a material known in the art, and usually comprised of a thermoplastic resin, a thermosetting resin, or the like. Resin used for the solder mask 19 can be appropriately selected. For example, the solder mask is preferably formed so as to have a thickness of 0.01 mm to 0.02 mm in order to protect the first metal films 21 and the second metal film 22.

The number of the solder masks 19 may be one or more. The solder mask 19 preferably covers edges in the longitudinal direction X of each of the first metal films 21 and the second metal film 22 on the back surface 20b of the base 15. In addition, the solder mask 19 more preferably covers the entire edges in the longitudinal direction of each of the first metal films 21 and the second metal film 22. This structure can effectively prevent or alleviate the first metal films 21 and the second metal film 22 from being delaminated. Also, covering the edges in the longitudinal direction of each of the first metal films 21 and the second metal film 22 with the solder mask 19 can alleviate short circuits between the first metal films 21 and the second metal film 22 via the bonding members. The solder mask 19 preferably covers part or the whole of an edge, of each of the first metal films 21 and/or the second metal film 22, close to the upper surface 20d on the back surface 20b of the base 15. Among such structures, a structure is more preferable that covers the entire edge of the second metal film 22 close to the upper surface 20d, and/or only part of the edge of the first metal films 21 close to the upper surface 20d. Furthermore, a structure is preferable that covers the entire edge, of the second metal film 22, close to the upper surface 20d and only part of the edges, of the first metal films 21, close to the upper surface 20d. Also, the solder mask 19 preferably extends from the edge at which the upper surface and the back surface of the base are in contact with each other to the edge at which the bottom surface and the back surface of the base are in contact with each other. This structure can further prevent or alleviate the first metal films 21 and/or the second metal film 22 from being delaminated.

The first metal films 21 and the second metal film 22 are exposed from the solder mask 19 on the back surface 20b of the base 15. The portions of the first metal films 21 exposed on the back surface 20b of the base 15 are preferably broader in the longitudinal direction X than the portion of the second metal film 22 exposed on the back surface 20b. If the first metal films 21 are broad in the longitudinal direction X, the heat dissipation of the light-emitting device is improved.

Light-Emitting Elements 13

The light-emitting elements 13 are connected to the wiring layers via the electrically-conductive bonding members and aligned in the longitudinal direction of the base 15. Materials known in the art can be used as the electrically-conductive bonding members. The light-emitting elements 13 are preferably aligned in a row in the longitudinal direction on the front surface 20a of the base 15. Alignment in a row can achieve slimming down of the light-emitting device.

The light-emitting elements 13 each include at least a semiconductor layered body. The semiconductor layered body includes an n-type semiconductor layer, a p-type semiconductor layer, and an active layer therebetween. Examples of semiconductor materials include nitride semiconductors, InAlGaAs-based semiconductors, InAlGaP-based semiconductors, zinc sulfide, zinc selenide, and silicon carbide. Among these materials, a nitride semiconductor is preferably used, because it can emit short-wavelength light efficiently capable of exciting phosphors. A nitride semiconductor is typically represented by the general formula $In_xAl_yGa_{1-x-y}N$ ($0 \leq x$, $0 \leq y$, $x+y \leq 1$).

The emission peak wavelengths of the light-emitting elements can be selected from the ultraviolet range to the infrared range by changing the semiconductor materials or their mixing ratios of the crystals. The emission peak wavelengths of the light-emitting elements are preferably 400 nm to 530 nm, more preferably 420 nm to 490 nm, further preferably 450 nm to 475 nm in view of light-emission efficiency, excitation of phosphors, color mixing relations with light emission of the phosphors, and the like.

In addition to the semiconductor layered body, the light-emitting elements may each include, a crystal growth substrate on which a semiconductor crystal to be constituting the semiconductor layered body can be grown. Alternatively, a support substrate may be included to be bonded to the semiconductor layered body that is separated from the crystal growth substrate. Examples of an element substrate include sapphire, gallium nitride, aluminum nitride, silicon, silicon carbide, gallium arsenide, gallium phosphide, indium phosphide, zinc sulfide, zinc oxide, zinc selenide, and diamond. Among these materials, sapphire is preferable. A light-transmissive element substrate facilitates employment of flip-chip mounting and enhancement of light extraction efficiency. The thickness of the element substrate is, for example, 0.02 mm to 1 mm.

The light-emitting element may include positive and negative electrodes and/or an insulating film. The positive and negative electrodes can contain gold, silver, tin, platinum, rhodium, titanium, aluminum, tungsten, palladium, nickel, or an alloy of these. The insulating film can include an oxide or nitride of at least one element selected from the group consisting of silicon, titanium, zirconium, niobium, tantalum, and aluminum.

The planar shape of each of the light-emitting elements is preferably a quadrangle, particularly a square or a rectangle that has longer sides in one direction, but a hexagon or the like is also possible. The lateral surfaces of the light-emitting elements or the lateral surfaces of their element substrates may be each perpendicular to the upper surface and/or the lower surface or may be inclined inward or outward. The light-emitting elements each preferably have the positive and negative (p and n) electrodes on the same surface.

Two or more light-emitting elements may be mounted in one light-emitting device. In this case, the emission wavelengths of the light-emitting elements may be either the same or different.

The light-emitting device in the present disclosure may include a protective element known in the art in addition to the light-emitting elements.

Light-Transmissive Members 18

The light-emitting device 10 preferably includes the light-transmissive members 18 on the light-extracting surfaces of the light-emitting elements 13, in other words, on the front surfaces side of the light-emitting device 10. With the light-transmissive members, the light-emitting elements are protected against external stress. The light-transmissive members transmit light emitted from the light-emitting elements to the outside of the light-emitting device. One light-transmissive member 18 may be provided for a plurality of light-emitting elements, but it is preferable that one light-transmissive member be provided for each light-emitting element.

Each of the light-transmissive members preferably has a light transmittance of 60% or more, preferably 80% or more, or 90% or more, at the emission peak wavelength of the corresponding light-emitting element.

The light-transmissive member can be formed of, for example, a light-transmissive matrix. The light-transmissive member preferably contains a filler and/or a phosphor that absorbs light from the light-emitting element to emit light. A sintered body of a phosphor and an inorganic material such as alumina, a plate-shaped crystal of the phosphor, or the like may be used as the light-transmissive member.

The light-transmissive member may contain a phosphor and/or a filler. The light-transmissive member may have a single-layer structure or a layered structure. In the case where the light-transmissive member contains a phosphor, the light-transmissive member includes a layer containing substantially no phosphor exist on a layer containing the phosphor. This structure allows the layer containing substantially no phosphor to also function as a protective layer, and thus can alleviate deterioration of the phosphor.

The matrix of the light-transmissive member may be formed of a sintered body of an inorganic material, such as glass and alumina, in order to provide a reliable light-emitting device.

Matrix of Light-Transmissive Members

Examples of the matrix of the light-transmissive member include silicone resins, epoxy resins, phenolic resins, polycarbonate resins, acrylic resins, modified resins of these resins, and glass. Among these materials, silicone resins and modified silicone resins are preferable due to their good heat and light resistance. Specific examples of the silicone resins include dimethyl silicone resins, phenyl-methyl silicone resins, and diphenyl silicone resins. The light-transmissive member can include one of these matrix materials, or include two or more of these matrix materials layered on each other.

Filler

Examples of the filler include silicon oxide, aluminum oxide, zirconium oxide, and zinc oxide. These materials can be used singly, or two or more of the materials can be used in combination as the filler. Silicon oxide, which has a small thermal expansion coefficient, is particularly preferable. Using nanoparticles as the filler increases scattering including Rayleigh scattering of blue light from the light-emitting elements and can reduce the quantity of a phosphor used. The nanoparticles are particles having a particle diameter of 1 nm to 100 nm. The "particle diameter" can be defined as, for example, $D_{50}$.

Phosphor

The phosphor is a substance that absorbs at least part of primary light emitted from the light-emitting element and emits secondary light different in wavelengths from the primary light. This structure can provide a light-emitting device that emits mixed light (i.e., white light) of the primary light and the secondary light both having visible wavelengths.

As the phosphor, a green-light-emitting phosphor can be used such as yttrium-aluminum-garnet phosphors (for example, $Y_3(Al,Ga)_5O_{12}:Ce$), lutetium-aluminum-garnet phosphors (for example, $Lu_3(Al,Ga)_5O_{12}:Ce$), terbium-aluminum-garnet phosphors (for example, $Tb_3(Al,Ga)_5O_{12}:Ce$) phosphors, silicate phosphors (for example, $(Ba,Sr)_2SiO_4$:Eu), chlorosilicate phosphors (for example, $Ca_8Mg(SiO_4)_4Cl_2$:Eu), β-SiAlON phosphors (for example, $Si_{6-z}Al_zO_zN_{8-z}$:Eu (0<z<4.2)), or SGS phosphors (for example, $SrGa_2S_4$:Eu). Examples of yellow-light emitting phosphors include α-SiAlON phosphors (for example, $M_z(Si,Al)_{12}(O,N)_{16}$ (where 0<z≤2, M is Li, Mg, Ca, Y, or a lanthanoid element except for La and Ce).

The light-transmissive member 18 may include a portion containing substantially no phosphor. Disposing the portion containing substantially no phosphor on or above a phosphor-containing portion can protect the phosphor against external environments, such as water.

In the case where a plurality of light-emitting elements 13 are included, the light-transmissive members 18 disposed on or above the front surfaces of the respective light-emitting elements may contain the same phosphor or different phosphors. For example, the light-emitting elements are referred to as a first light-emitting element and a second light-emitting element, a light-transmissive member disposed on or above the front surface of the first light-emitting element is referred to as a first light-transmissive member, and a light-transmissive member disposed on or above the front surface of the second light-emitting element is referred to as a second light-transmissive member. The first light-transmissive member may absorb light from the first light-emitting element to emit white light as the mixture with the light from the first light-emitting element, and the second light-transmissive member may absorb light from the second light-emitting element to emit orange light as the mixture with the light from the second light-emitting element.

The light-transmissive members 18 are joined to the front surfaces of the light-emitting elements. The joining of the light-transmissive member 18 can be performed with or without an adhesive. The adhesive is preferably a light-transmissive material that can ensure adhesion between the light-emitting elements and the light-transmissive members. Examples of the adhesive include silicone resins, epoxy resins, phenolic resins, polycarbonate resins, acrylic resins, and modified resins of these resins. Among these resins, silicone resins and modified silicone resins are preferable due to their good heat and light resistance. Examples of silicone resins include dimethyl silicone resins, phenyl-methyl silicone resins, and diphenyl silicone resins. Similarly to the light-transmissive members, the adhesive may also contain a filler.

Covering Member 14

The covering member 14 covers the lateral surfaces of the light-emitting elements 13 and part of the front surface 20a of the base 15.

The covering member 14 is preferably a light-reflective member in view of improvement in the light extraction efficiency of the light-emitting device. The term "light-reflective" means, for example, that the reflectance of light at emission peak wavelengths of the light-emitting elements is 70% or more.

The outer shape of the covering member 14 in a front view is preferably a quadrangle, more preferably a quadrangle having longer sides in the direction in which the pair of the wiring layers 16 are aligned as described above. This structure can make the light-emitting device preferable for use as a light source for a backlight.

In the case where the light-transmissive members 18 are bonded to the light-extracting surfaces of the light-emitting elements, the lateral surfaces of the light-transmissive members 18 are preferably covered with the covering member 14. In this case, the covering member 14 preferably covers the entire lateral surfaces of the light-transmissive members 18, but may cover only part of the lateral surfaces thereof. In the case where the adhesive that bonds the light-transmissive members 18 covers part of the lateral surfaces of the light-emitting elements, the covering member 14 preferably covers the entire lateral surfaces of the light-emitting elements 13 with the adhesive interposed therebetween.

The front surfaces of the light-transmissive members 18 are preferably flush with the front surface of the covering member 14.

The covering member 14 preferably includes a matrix and a light-reflective substance.

Matrix of Covering Member

A matrix used for the covering member 14 is preferably one that changes from a liquid into a solid by hardening, in view of ease of manufacture. The covering member 14 can be formed by transfer molding, injection molding, compression molding, potting, or the like.

A resin can be used as the matrix of the covering member. Examples of the resin include silicone resins, epoxy resins, phenolic resins, polycarbonate resins, acrylic resins, and modified resins of these resins. Among these resins, silicone resins and modified silicone resins is preferable due to their good heat and light resistance. Specific examples of the silicone resins include dimethyl silicone resins, phenylmethyl silicone resins, and diphenyl silicone resins.

Light-Reflective Substance

Examples of the light-reflective substance include white pigments.

Examples of the white pigments include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. These substances can be used singly, or two or more of these substances can be used in combination. The shape of the white pigments may be irregular or crushed but is preferably spherical in view of fluidity. The particle diameter of the white pigments is, for example, about 0.1 µm to 0.5 µm. The particle diameters of white pigments are preferably smaller to enhance effects of light reflection and covering. The content of the light-reflective substance in the covering member is preferably 10 wt % to 80 wt %, more preferably 20 wt % to 70 wt %, further preferably 30 wt % to 60 wt % relative to the total weight of the covering member in view of light reflectivity, the viscosity in a liquid state, and the like.

The covering member may further contain a filler. Examples of the filler include silicon oxide, aluminum oxide, zirconium oxide, and zinc oxide. These fillers can be used singly, or two or more of these fillers can be used in combination. Silicon oxide is particularly preferable due to its small thermal expansion coefficient.

Examples of the bonding members that bond the light-emitting device to the mounting board include: bumps containing gold, silver, copper, and the like: metal pastes each containing resin binder and a powder of a metal such as silver, gold, copper, platinum, aluminum, and palladium; tin-bismuth, tin-copper, tin-silver, and gold-tin solders; and brazing filler metals such as low-melting-point metals.

The following describes specific examples of the light-emitting device according to the present application in detail on the basis of the drawings.

First Embodiment

As shown in FIGS. 1, 2A, 2B, and 3A to 3D, the light-emitting device 10 according to a first embodiment is a side-view light-emitting device measuring 3.1 mm in a longitudinal direction X, 0.4 mm in a width direction Y, and 0.7 mm in depth.

The base 15 is a rectangular-cuboid piece comprising a BT resin (for example, HL832NSF type LCA manufactured by Mitsubishi Gas Chemical Company, Inc.) having a linear expansion coefficient of about 3 ppm/° C. The base 15 has dimensions of 3.1 mm in the longitudinal direction X, 0.4 mm in the width direction Y, and 0.36 mm in depth (i.e., thickness). The wiring layers 16 are disposed on the front surface of the base 15 and has a layered structure of copper/nickel/gold layered from the surface close to the front surface of the base 15. A pair of wiring layers 16 correspond to a pair of positive and negative electrodes and are aligned in the longitudinal direction. One more wiring layers 16 are disposed therebetween. The substrate 20 has two first via holes 17a and two second via holes 17b, and the pair of the wiring layers 16 formed on the front surface 20a extend to the inside of the via holes 17a and 17b.

In a back view, the substrate 20 has the pair of semicircular first depressed portions 11 and the semicircular second depressed portion 12 therebetween, each opening to the back surface 20b and the bottom surface 20c. The pair of first depressed portions 11 are respectively disposed on both sides in the longitudinal direction X of the substrate 20. The pair of first depressed portions 11 and the second depressed portion 12 are each separated from the via holes 17a and 17b of the substrate 20.

The first depressed portions 11 have a width M of 0.35 mm in the longitudinal direction X on the side defined by the bottom surface 20c being in contact with the back surface 20d of the substrate 20. The first depressed portions 11 have a height H of 0.15 mm in the width direction Y from the side defined by the bottom surface 20c being in contact with the back surface 20d of the substrate 2. The first depressed portions 11 each have a depth D of 0.21 mm from the back surface 20b toward the front surface 20a side. The two first depressed portions 11 are formed on the back surface 20b while each having 0.25 mm distance from an edge close to the lateral surface 20e. The two first depressed portions 11 are bilaterally symmetric about the center line of the base 15 parallel to the width direction Y on the back surface 20b of the base 15.

The second depressed portion 12 has a maximum width N of 0.45 mm in the longitudinal direction X on the side that the bottom surface 20c is in contact with the back surface 20d of the substrate 20. The second depressed portion 12 has a height J of 0.2 mm in the width direction Y from the side defined by the bottom surface 20c being in contact with the back surface 20d of the substrate 2. The second depressed portion 12 has a depth D 0.21 mm from the back surface 20b toward the front surface 20a side.

The first metal films 21 and the second metal film 22 respectively cover the entire inner walls of the first depressed portions 11 and the second depressed portion 12 and extend to the back surface 20b. Also, the wiring layers 16 inside the via holes 17a are connected to the first metal films 21. In addition, the wiring layers 16 inside the second via holes 17b are connected to the second metal film 22.

The first metal films 21 and the second metal film 22 have large areas on the back surface 20b, and part of the base 15 is exposed at an edge close to the upper surface 20d on the back surface 20b. In other words, the first metal films 21 and the second metal film 22 are disposed such that part of the base 15 close to the upper surface 20d is exposed. The width L of the exposed portion is 0.08 mm.

As seen from the back surface 20b, the first metal films 21 and the second metal film 22 are connected to an edge close to the bottom surface 20c, are not connected to an edge close to the upper surface 20d, and are separated from one another. The first metal films 21 are smaller than the second metal film 22 in both of the longitudinal direction X and the width direction Y. For example, the first metal films 21 each measure 0.87 mm×0.3 mm while the second metal film 22 measures 1.06 mm×0.35 mm.

The first metal films 21 and the second metal film 22 are films formed by Ni/Au electroplating and each have a thickness of 0.2 µm.

The solder mask 19 is disposed on the back surface 20b of the base 15, and covers at least part of each of the first metal films 21 and the second metal film 22. The solder mask 19 comprises an acrylate resin. The solder mask 19 has a thickness of 0.35 mm.

Three solder masks 19 are disposed on the back surface 20b of the base 15, and cover the whole of the corresponding edges in the longitudinal direction X of the first metal films 21 and the second metal film 22. The solder mask 19 covers part of the edges close to the upper surface 20d on the first metal films 21, and the entire edge close to the upper surface 20*d* on the second metal film 22. The first metal films 21 and the second metal film 22 are exposed from the solder masks 19 on the back surface 20*b* of the base 15, and the portions of the first metal films 21 exposed on the back surface 20*b* are wider than the portion of the second metal film 22 exposed on the back surface 20*b*, in the longitudinal direction X.

Part of the base 15 on the back surface 20*b* is exposed from the first metal films 21 at a position close to the upper surface 20*d* in a region narrower than the widths in the longitudinal direction X of the first metal films 21.

Two light-emitting elements 13 are flip-chip mounted on the wiring layers 16 on the front surface of the base 15 with bonding members made of a gold-tin solder (Au:Sn=79:21) therebetween. Each of the light-emitting elements 13 is a rectangular-cuboid LED chip that includes an n-type layer, an active layer, and a p-type layer made of nitride semiconductors layered in order on a sapphire substrate. The light-emitting elements can each emit blue light having emission peak wavelength of 452 nm, and each measure 1.1 mm in width, 0.2 mm in height, and 0.12 mm in depth (thickness).

The light-transmissive members 18 are respectively bonded to the front surfaces of the light-emitting elements 13 with a light-transmissive adhesive. The light-transmissive members 18 each contain a manganese-activated fluoride phosphor and a β-SiAlON-based phosphor as phosphors mixed in a phenyl-methyl silicone resin matrix. Each of the light-transmissive members 18 is a rectangular-cuboid piece measuring 1.21 mm in width, 0.24 mm in height, and 0.16 mm in depth (thickness). The light-transmissive members 18 each include a layer mainly containing the matrix and the phosphors, and a layer mainly containing the matrix stacked from the light-emitting elements 13 side. The adhesive mainly contains a dimethyl silicone resin.

The covering member 14 having light-reflectivity is formed on the front surface of the base 15 to surround the upper side of the wiring layers 16 and the entire lateral peripheries of the light-emitting elements 13 and the light-transmissive members 18. The covering member 14 contains 60 wt % of titanium oxide as a white pigment mixed in a phenyl-methyl silicone resin. The covering member 14 and the light-transmissive members 18 constitute substantially the same surface on the front surface 20*a* of the light emitting device 10. It is preferable that the lateral surfaces of the covering member in the width direction be substantially flush with the lateral surfaces of the base in the width direction. Also, it is preferable that the lateral surfaces of the covering member in the longitudinal direction be substantially flush with the lateral surfaces of the base in the longitudinal direction. This structure enables miniaturization of the light-emitting device.

For comparison with the above light-emitting device, a light-emitting device 40 was produced that is substantially the same as in the first embodiment except for three depressed portions 41, three metal films 42, and a solder mask 43. In the light-emitting device 40, the base is similarly exposed from the solder mask 43 on the upper side of the base, and the solder mask 43 equally covers the three metal films 42 on the back surface of the substrate as shown in FIG. 4 instead of the pair of first depressed portions 11, the second depressed portion 12, the first metal films 21 and the second metal film 22, and the solder mask 19 described above.

Figure 4:
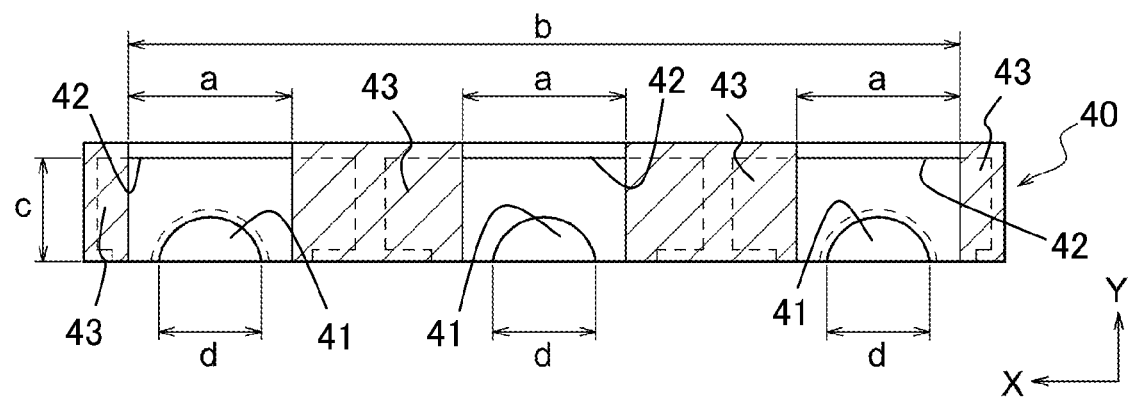
FIG. 4 is a schematic back view of a light-emitting device to be compared with the light-emitting device in FIG. 1.

In FIG. 4, the values were set such that a=0.65 mm, b=2.85 mm, c=0.35 mm, and d=0.25 mm.

For each of the light-emitting device 10 according to the first embodiment and the light-emitting device 40 bonded to mounting boards with a gold-tin solder (Au:Sn=79:21), the fixing strength to the mounting board and the mountability were evaluated with n=24 or 25.

To measure the fixing strength, the light-emitting device 10 and the light-emitting device 40 were first mounted on the mounting boards with their bottom surfaces facing the mounting boards, and loads were applied to each of the light-emitting device 10 and the light-emitting device 40 with a stainless-steel flat plate that had contact with the entire light-extracting surfaces (i.e., front surfaces) of the light-emitting devices. The loads when the light-emitting device 10 and the light-emitting device 40 were delaminated from the mounting boards were then measured.

To measure the mountability, the light-emitting device 10 and the light-emitting device 40 were mounted on the mounting boards with the solder therebetween. Then, the frequency of the Manhattan phenomenon that is, for example, the light-emitting device 10 and the light-emitting device 40 incline on the mounting boards or the back surfaces of the substrates stand to face the mounting boards after the reflow soldering, was confirmed.

From the results, it was found that the light-emitting device 10 was equivalent to the light-emitting device 40 in fixing strength. Regarding mountability, it was found that the mounting defective rate of the light-emitting device 10 was reduced to 0% whereas the mounting defective rate of the light-emitting device 40 was 25%. Hence, occurrence of the Manhattan phenomenon was suppressed by the improvement in the bonding strength of the light-emitting device 10. The light-emitting device is thus stably fixed to the mounting board, therefore the alignment and the heat dissipation of the light-emitting device become better.

Second Embodiment

Figure 5:
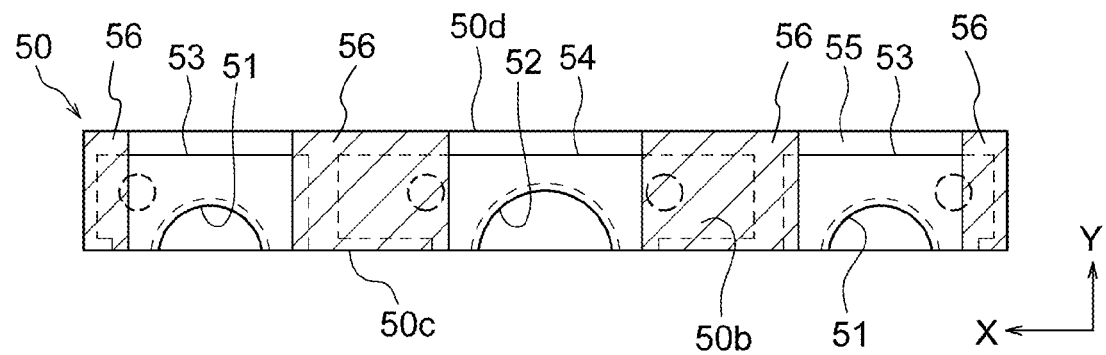
FIG. 5 is a schematic back view of a light-emitting device representing another embodiment.

A light-emitting device according to a second embodiment has substantially the same structure as the light-emitting device 10 according to the first embodiment except that the back surface of the light-emitting device is different as shown in FIG. 5.

First metal films 53 and a second metal film 54 respectively are formed to extend to a back surface 50*b* from inside first depressed portions 51 and a second depressed portion 52 that open to the back surface 50*b* and a bottom surface 50*c* of a base 55. First metal films 53 and a second metal film 54 respectively have substantially the same width in the Y direction. The first metal films 53 are shorter than the first metal films 21 of the light-emitting device 10 in the X direction, and the second metal film 54 is longer than the second metal film 22 of the light-emitting device 10 in the longitudinal direction X. Solder masks 56 cover the second metal film 54 on the back surface 50*b* along the shape of the second depressed portion 52.

The light-emitting device including a substrate 50 having such a structure also has effects similar to the effects of the light-emitting device 10 according to the first embodiment.

Third Embodiment

Figure 6:
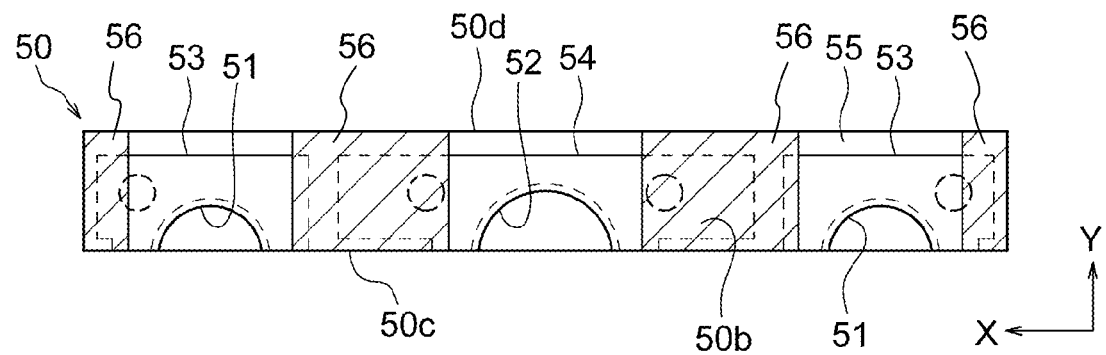
FIG. 6 is a schematic back view of a light-emitting device representing still another embodiment.

A light-emitting device according to a third embodiment has substantially the same structure as the light-emitting devices according to the first and second embodiments except that the back surface of the light-emitting device is different as shown in FIG. 6.

First metal films 63 and a second metal film 64 are respectively formed to extend to a back surface 60*b* from inside first depressed portions 61 and a second depressed portion 62 that open to the back surface 60*b* and a bottom surface 60*c* of a base 85. First metal films 63 and a second metal film 64 respectively have substantially the same width in the Y direction. The first metal films 63 are shorter than the first metal films 21 of the light-emitting device 10 in the longitudinal direction X, and the second metal film 64 is longer than the second metal film 22 of the light-emitting device 10 in the longitudinal direction X. Solder masks 66 cover the second metal film 64 on the back surface 60*b* along the shape of the second depressed portion 62.

Second via holes 67*b* connected to the second metal film 64 are formed closer to the second depressed portion 62 than the distance between the first via holes 17*b* and the second depressed portion 12 of the light-emitting device 10. In addition, two first via holes 67*a* connected to the corresponding first metal film 63 are formed for each of the first metal films 63.

The light-emitting device including a substrate 60 having such a structure also has effects similar to the effects of the light-emitting device 10 according to the first embodiment.

The light-emitting device according to the present disclosure can be used for backlight devices for liquid-crystal displays, various lighting apparatuses, large size displays, various displays for advertisements and destination guide, and projectors, as well as for image scanners for apparatuses such as digital video cameras, facsimile machines, copying machines, and scanners.

What is claimed is:

1. A light-emitting device comprising:
a substrate including
a base having
a front surface extending in a longitudinal direction and a width direction,
a back surface opposite to the front surface,
a bottom surface adjacent to the front surface and extending in the longitudinal direction and a depth direction, the longitudinal direction being orthogonal to the width direction, and the depth direction being orthogonal to the width direction and the longitudinal direction, and
an upper surface opposite to the bottom surface,
the base defining a pair of first depressed portions opening on the back surface and the bottom surface of the base and positioned on both end sides of the base in the longitudinal direction,
the base defining a second depressed portion opening on the back surface and the bottom surface of the base, disposed between the pair of first depressed portions, and having a width larger than a width of each of the first depressed portions as measured along the width direction,
first metal films extending respectively from inside the first depressed portions to the back surface of the base and defining a pair of first metal film depressed portions,
a second metal film extending from inside the second depressed portion to the back surface of the base and defining a second metal film depressed portion disposed between the pair of first depressed portions, the second metal film depressed portion having a width larger than a width of each of the first depressed portions as measured along the width direction, and
a solder mask covering at least a part of each of the first metal films and at least a part of the second metal film on the back surface of the base, and
a wiring layer on the front surface of the base;
a plurality of light-emitting elements connected to the wiring layer and aligned along the longitudinal direction; and
a covering member having light reflectivity, the covering member covering at least a part of a lateral surface of each of the plurality of light-emitting elements and at least a part of the front surface of the base.

2. A light-emitting device comprising:
a substrate including
a base having
a front surface extending in a longitudinal direction and a width direction,
a back surface opposite to the front surface,
a bottom surface adjacent to the front surface and extending in the longitudinal direction and a depth direction, the longitudinal direction being orthogonal to the width direction, and the depth direction being orthogonal to the width direction and the longitudinal direction, and
an upper surface opposite to the bottom surface,
the base defining a pair of first depressed portions opening on the back surface and the bottom surface of the base and positioned on both end sides of the base in the longitudinal direction,
the base defining a second depressed portion opening on the back surface and the bottom surface of the base, disposed between the pair of first depressed portions, and having a width larger than a width of each of the first depressed portions as measured along the width direction,
first metal films extending respectively from inside the first depressed portions to the back surface of the base,
a second metal film extending from inside the second depressed portion to the back surface of the base, and
a solder mask covering at least a part of each of the first metal films and at least a part of the second metal film on the back surface of the base, and
a wiring layer on the front surface of the base;
a plurality of light-emitting elements connected to the wiring layer and aligned along the longitudinal direction; and
a covering member having light reflectivity, the covering member covering at least a part of a lateral surface of each of the plurality of light-emitting elements and at least a part of the front surface of the base, wherein
the base of the substrate defines at least one first via hole, and
the wiring layer is connected to at least one of the first metal films disposed inside the first depressed portions via the at least one first via hole.

3. The light-emitting device according to claim 2, wherein the base of the substrate defines at least one second via hole, and
the wiring layer is connected to the second metal film via the at least one second via hole.

4. The light-emitting device according to claim 1, wherein the second metal film is separated from the upper surface of the base.

5. The light-emitting device according to claim 1, wherein the base has a first edge at which the upper surface intersects the back surface of the base, and a second edge at which the bottom surface of the base intersects the back surface of the base, and
the solder mask extends from the first edge to the second edge of the base.

6. The light-emitting device according to claim 1, wherein
the first metal films and the second metal film are exposed from the solder mask on the back surface of the base, and
the first metal films exposed on the back surface of the base each has a width less than a width of the second metal film exposed on the back surface of the base as measured along the longitudinal direction.

7. The light-emitting device according to claim 1, further comprising
a light-transmissive member disposed on or above a front surface of each of the light-emitting elements.

8. The light-emitting device according to claim 7, wherein
the covering member covers at least one lateral surface of the light-transmissive member.

9. The light-emitting device according to claim 1, wherein
a lateral surface of the covering member at an end in the width direction is substantially flush with a lateral surface of the base at an end in the width direction.

10. The light-emitting device according to claim 1, wherein
the base of the substrate defines at least one via hole, and
the wiring layer is connected to the second metal film via the at least one via hole.

11. The light-emitting device according to claim 1, wherein
the wiring layer has a back surface opposite from a front surface on which the light-emitting elements are arranged, and
the back surface of the wiring layer faces the front surface of the base.

12. The light-emitting device according to claim 2, wherein
the second metal film is separated from the upper surface of the base.

13. The light-emitting device according to claim 2, wherein
the base has a first edge at which the upper surface of the base intersects the back surface of the base, and a second edge at which the bottom surface of the base intersects the back surface of the base, and
the solder mask extends from the first edge to the second edge of the base.

14. The light-emitting device according to claim 2, wherein
the first metal films and the second metal film are exposed from the solder mask on the back surface of the base, and
the first metal films exposed on the back surface of the base each has a width less than a width of the second metal film exposed on the back surface of the base as measured along the longitudinal direction.

15. The light-emitting device according to claim 2, further comprising
a light-transmissive member disposed on or above a front surface of each of the light-emitting elements.

16. The light-emitting device according to claim 15, wherein
the covering member covers at least one lateral surface of the light-transmissive member.

17. The light-emitting device according to claim 2, wherein
a lateral surface of the covering member at an end in the width direction is substantially flush with a lateral surface of the base at an end in the width direction.

* * * * *